US006972382B2

(12) United States Patent
Zollo et al.

(10) Patent No.: US 6,972,382 B2
(45) Date of Patent: Dec. 6, 2005

(54) INVERTED MICROVIA STRUCTURE AND METHOD OF MANUFACTURE

(75) Inventors: James A. Zollo, Weston, FL (US); Nitin B. Desai, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 110 days.

(21) Appl. No.: 10/626,242

(22) Filed: Jul. 24, 2003

(65) Prior Publication Data

US 2005/0016768 A1 Jan. 27, 2005

(51) Int. Cl.[7] .......................... H05K 1/11; H01R 12/04

(52) U.S. Cl. ...................... 174/262; 174/266; 361/794; 29/830

(58) Field of Search ................................ 174/262, 261, 174/250, 266, 260, 259, 258; 361/760, 792, 361/795

(56) References Cited

U.S. PATENT DOCUMENTS 5,315,072 A * 5/1994 Arai et al. .................. 174/262
5,495,665 A * 3/1996 Carpenter et al. ............ 29/830
5,509,200 A * 4/1996 Frankeny et al. ............. 29/852
5,758,413 A * 6/1998 Chong et al. ................. 29/852
6,580,036 B2 * 6/2003 Kim et al. .................. 174/261

OTHER PUBLICATIONS

"*HDI's Beneficial Influence on High-Frequency Signal Integrity*," Happy Holden, Westwood Associates, West Haven, CT.

* cited by examiner

*Primary Examiner*—Kamand Cuneo
*Assistant Examiner*—Ishwar I.B. Patel

(57) ABSTRACT

A multilayer circuit board (50) includes a plurality of substrate cores (34 and 44), an adhesive/bonding layer (55) between at least two among the plurality of substrate cores, and a microvia (35 and 45) in each of at least two of the plurality of substrate cores. The microvia includes a conductive interconnection (39) between a top conductive surface and a bottom conductive surface of each of the plurality of substrate cores and the microvia in a first substrate core is arranged to be inverted relative to a microvia in a second substrate core. The multilayer circuit board can further include a plated through-hole (54) through the plurality of substrate cores and the adhesive/bonding layer such that at least two among the top conductive surfaces (32 or 46) and the bottom conductive surfaces (36 or 42) of the plurality of substrate cores are connected.

17 Claims, 4 Drawing Sheets

10

20

INVERTED MICROVIA STRUCTURE AND METHOD OF MANUFACTURE

CROSS-REFERENCE TO RELATED APPLICATIONS

Not applicable

FIELD OF THE INVENTION

This invention relates generally to printed circuit boards, and more particularly to a printed circuit board having microvias.

BACKGROUND OF THE INVENTION

The increasingly widespread use of fine-pitch Ball-Grid Array (BGA), Chip Scale Packaging (CSP), and other evolving technology form-factors means that new fabrication techniques must be used to create printed circuit boards (PCBs). Additionally, efforts to reduce costs further compound the problems associated with the smaller, denser, lighter, and faster systems that are evolving.

The use of microvia circuit interconnects in PCBs is currently one of the most viable solutions on the market. Adopting microvia technology means that products can use the newest, smallest, and fastest devices, meet stringent RFI/EMI requirements, and keep pace with downward-spiraling cost targets.

Microvias are vias of less than or equal to 6 mils (150 micron) in diameter. Their most typical use today is in blind and buried vias used to create interconnections through one dielectric layer within a PCB. Microvias are commonly used in blind via constructions where the outer layers of a multi-layer PCB are connected to the next adjacent signal layer. Used in all forms of electronic products, they effectively allow for the cost effective fabrication of high-density assemblies. The IPC has selected High-Density Interconnection Structures (HDIS) as a term to refer to all of these various microvia technologies.

Although microvias themselves offer several distinct advantages over their mechanically created counterparts including higher circuit densities and better electrical performance enabling the use of some of the smallest and most advanced components available, there are still several ways to obtain even higher circuit densities and additional advantages as will be further discussed below. Current microvia architectures have the advantages of lower costs through board size reduction (easily up to 40 percent) and layer elimination (up to 33 percent), lower substrate weight, thickness, and volume, closer component spacing with more connections per component.

Additional advantages of microvias include higher density at a lower cost, improved reliability where the thin nature and 1:1 aspect ratio of microvias deliver increased reliability over larger drilled through-holes, improved electrical performance (signal integrity) where HDI has one-tenth the parasitic, inductance, and capacitance of through-holes, fewer stubs, less reflections, less ground bounce, and better noise margins. Furthermore, microvias provide lower RFI/EMI since ground planes are closer or on the surface and distributed capacitance is available, improved thermal efficiency, greater design efficiency wherein microvias allow ease of part placement on both sides of an assembly as well as improved component escape routing (via-in-pad). Finally, microvias also enable faster time-to-market.

Still, current manufacturing techniques and PCBs with microvia architectures can improve in one or more aspects to increase their ability to rout finer pitch devices within a interconnect structure, significantly increase the functionality of the board structure, significantly increase the routing density of an established interconnect structure, and reduce the overall size of the board. Additionally, current microvia architectures fail to interconnect multiple layers vertically with a micro via without any additional area and fail to provide a pad cap for component processing which does not allow pad stacks with vias.

Other technologies and existing microvia technologies have various detriments. Plated through-hole and controlled depth technology have several disadvantages with respect to size and cost, particularly the cost and process requirements to fabricate pad structures associated with this via. Simple microvia structures fail to allow interconnection between multiple layers. Staggered via structures such as the stair-step structure 10 of FIG. 1 allows interconnection between multiple layers, but they take up significantly more area. The structure 10 includes a core laminate 14 having staggered vias 11 and 9 on a top surface and staggered vias 17 and 19 on a bottom surface. The structure 10 also includes conductive runners 13 on a prepreg laminate 12 on the top surface as well as conductive runners 15 on another prepreg laminate on the bottom surface. The structure 10 also includes a plated through-hole 16.

Stacked via structures such as the basic microvia structure 20 of FIG. 2 requires additional process steps, namely a first structured via process requiring a bottom via to be filled with copper. Typically, the structure 20 includes core laminate substrates 24 sandwiched between prepreg laminate layers 22. In addition to conductive layers 23, plated through-hole 29, and micovias 21, the structure 20 includes a staggered via or a second via structure 25 with a much larger via opening on top to a smaller via 26. This requires additional cost and area.

Yet another structure is a filled via with plated caps. Such a structure requires via filling processes and additional plating processes. Filled vias with plated caps also suffer from reliability issues unless gassing is properly handled. Vias with filled copper structures add significantly more resistance to the conductor segment and overall adds significant process cost.

SUMMARY OF THE INVENTION

Embodiments in accordance with the invention illustrate a structure and a method of fabricating a micro via so that a reduced number of processes are used. The structure can define a via structure which will limit the area needed to interconnect multiple layers in a cost effective manner.

In a first aspect of the present invention, a method of forming a multilayer circuit board having inverted microvias can include the steps of providing at least a first substrate core and a second substrate core each of the first substrate core and the second substrate core having a top conductive layer on at least a top side, forming a microvia on a bottom side of at least one among the first substrate core and the second substrate core, wherein the microvia would reach to the top conductive layer on at least the top side of at least one among the first substrate core and the second substrate core, applying a conductive layer to the microvia to interconnect a bottom conductive layer of at least one among the first substrate core and the second substrate core to the top conductive layer of at least one among the first substrate core and the second substrate core, and patterning at least one among the top conductive layer and the bottom conductive layer of at least one among the first substrate core and the second substrate core. The method can further include the steps of applying an adhesive/bonding layer between at least the first substrate core and the second substrate core, forming a hole through the first substrate core, the adhesive/bonding layer and the second substrate core, and applying a conductive layer to the hole to interconnect at least two among the top conductive layer of the first substrate core, the top conductive layer of the second substrate core, the bottom conductive layer of the first substrate core, and the bottom conductive layer of the second substrate core. The first substrate core and the second substrate core can be laminated together by curing the adhesive/bonding layer in a vacuum lamination press for example.

The method can further include the steps of applying an external dielectric layer to at least one among the top conductive layer of the first substrate core and the top conductive layer of the second substrate core and applying an external conductive layer to the external dielectric layer. The method can additionally include the step of creating a microvia through at least one among the external dielectric layer and the external conductive layer to expose at least one among the top conductive layer of the first substrate core and the top conductive layer of the second substrate core and then applying a conductive layer to the microvia to interconnect the external conductive layer to at least one among the top conductive layer of the first substrate core and the second substrate core. The method can further include the step of forming a hole through the external conductive layer, the external dielectric layer, and well as the first substrate core, the adhesive/bonding layer and the second substrate core and applying a conductive layer to the hole to interconnect at least two among the external conductive layer, the top conductive layer of the first substrate core, the top conductive layer of the second substrate core, the bottom conductive layer of the first substrate core, and the bottom conductive layer of the second substrate core.

The step of forming the microvia can include the step of forming the microvia on the bottom side of the first substrate core and forming a separate microvia on the bottom side of the second substrate core such that each microvia reaches the respective top conductive layer on the first substrate core and the second substrate core. The step of patterning can include the step of patterning the top conductive layer and the bottom conductive layer of the first substrate core and patterning the top conductive layer and the bottom conductive layer of the second substrate core. The step of applying the adhesive/bonding layer can include applying a dielectric layer between the bottom layers of the first substrate core and the second substrate core or alternatively applying a dielectric layer on at least exposed portions of the first substrate core and the second substrate core and on at least portions of the bottom conductive layer of the first substrate core and the bottom conductive layer of the second substrate core.

In a second aspect of the present invention, a multilayer circuit board having inverted microvias can include at least a first substrate core and a second substrate core each of said first substrate core and said second substrate core having a top conductive layer on at least a top side, a microvia on a bottom side of at least one among the first substrate core and the second substrate core, wherein the microvia would reach to the top conductive layer on at least the top side of at least one among the first substrate core and the second substrate core, and a conductive layer applied to the microvia interconnecting a bottom conductive layer to the top conductive layer of at least one among the first substrate core and the second substrate core. The multi-layer circuit board can also include an adhesive/bonding layer between at least the first substrate core and the second substrate core, a hole through the first substrate core, the adhesive/bonding layer and the second substrate core, and a conductive layer applied to the hole to interconnect at least two among the top conductive layer of the first substrate core, the top conductive layer of the second substrate core, the bottom conductive layer of the first substrate core, and the bottom conductive layer of the second substrate core.

It should be noted that at least one among the top conductive layer of the first substrate core, the top conductive layer of the second substrate core, the bottom conductive layer of the first substrate core, and the bottom conductive layer of the second substrate core can define a predefined pattern. The multilayer circuit board can further include an external dielectric layer on at least one among the top side of the first substrate core and the top side of the second substrate core and an external conductive layer on the external dielectric layer. The multilayer board can also include a hole that further goes through the external dielectric layer and the external conductive layer.

In a third aspect of an embodiment of the present invention, a multilayer circuit board includes a plurality of substrate cores, an adhesive/bonding layer between at least two among the plurality of substrate cores, and a microvia in each of at least two of the plurality of substrate cores. The microvia includes a conductive interconnection between a top conductive surface and a bottom conductive surface of each of the plurality of substrate cores and the microvia in a first substrate core is arranged to be inverted relative to a microvia in a second substrate core. The multilayer circuit board can further include a plated through-hole through the plurality of substrate cores and the adhesive/bonding layer such that at least two among the top conductive surfaces and the bottom conductive surfaces of the plurality of substrate cores are connected. The plated through-hole can also go through the plurality of substrate cores, the external dielectric layer, and the adhesive/bonding layer such that the plated through-hole connects at least two among the external conductive layer, the top conductive surfaces of the plurality of substrate cores, and the bottom conductive surfaces of the plurality of substrate cores.

DETAILED DESCRIPTION OF THE DRAWINGS

Figure 1:
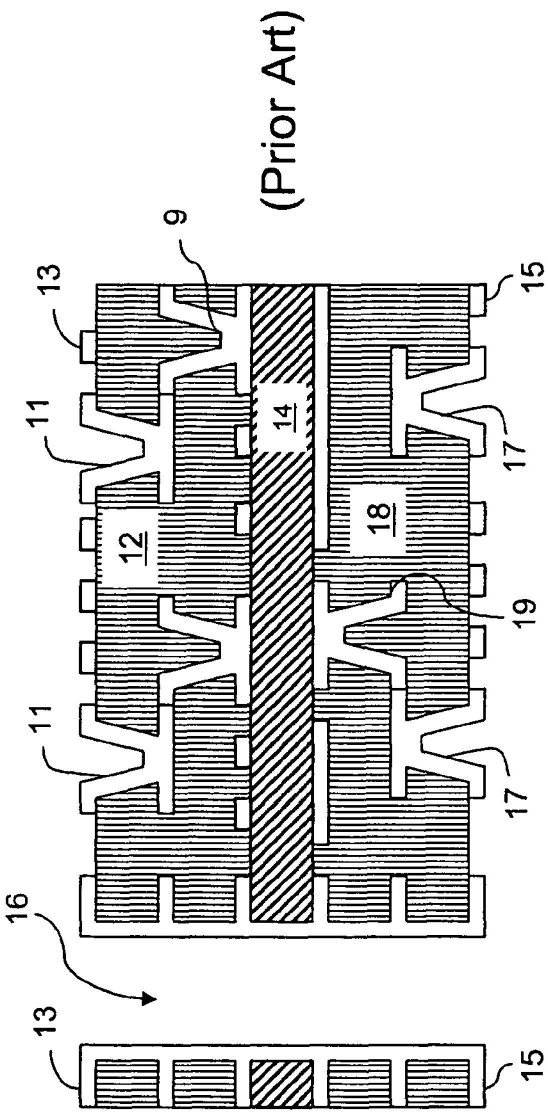
FIG. 1 is a cut-view of a traditional microvia structure including staggered microvias.
Figure 2:
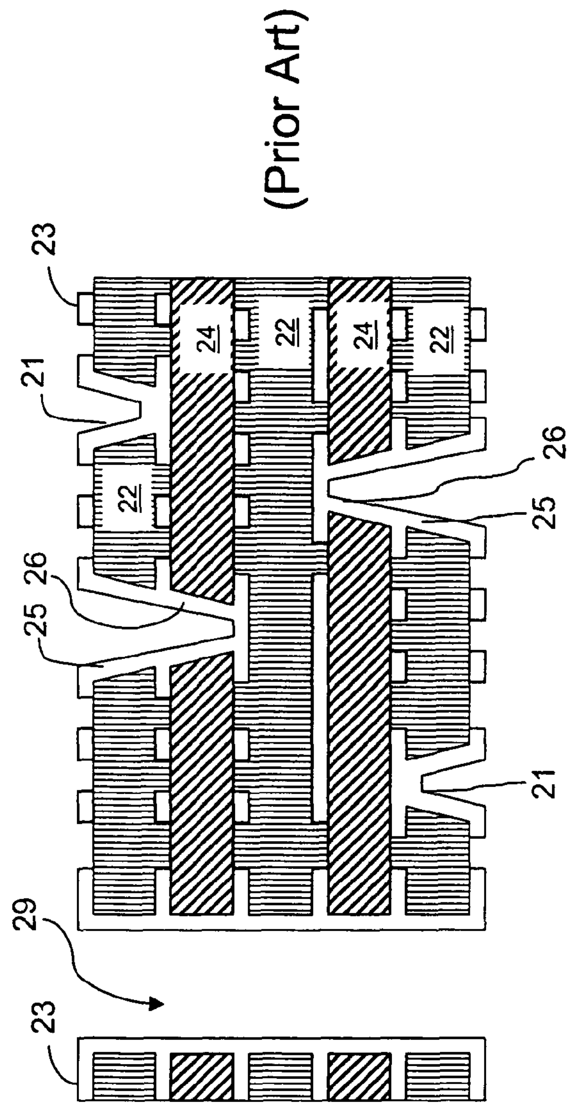
FIG. 2 is a cut view of another traditional microvia structure including stacked microvias.
Figures 3A, 3B, 3C, 4, 5A, 5B, 5C:
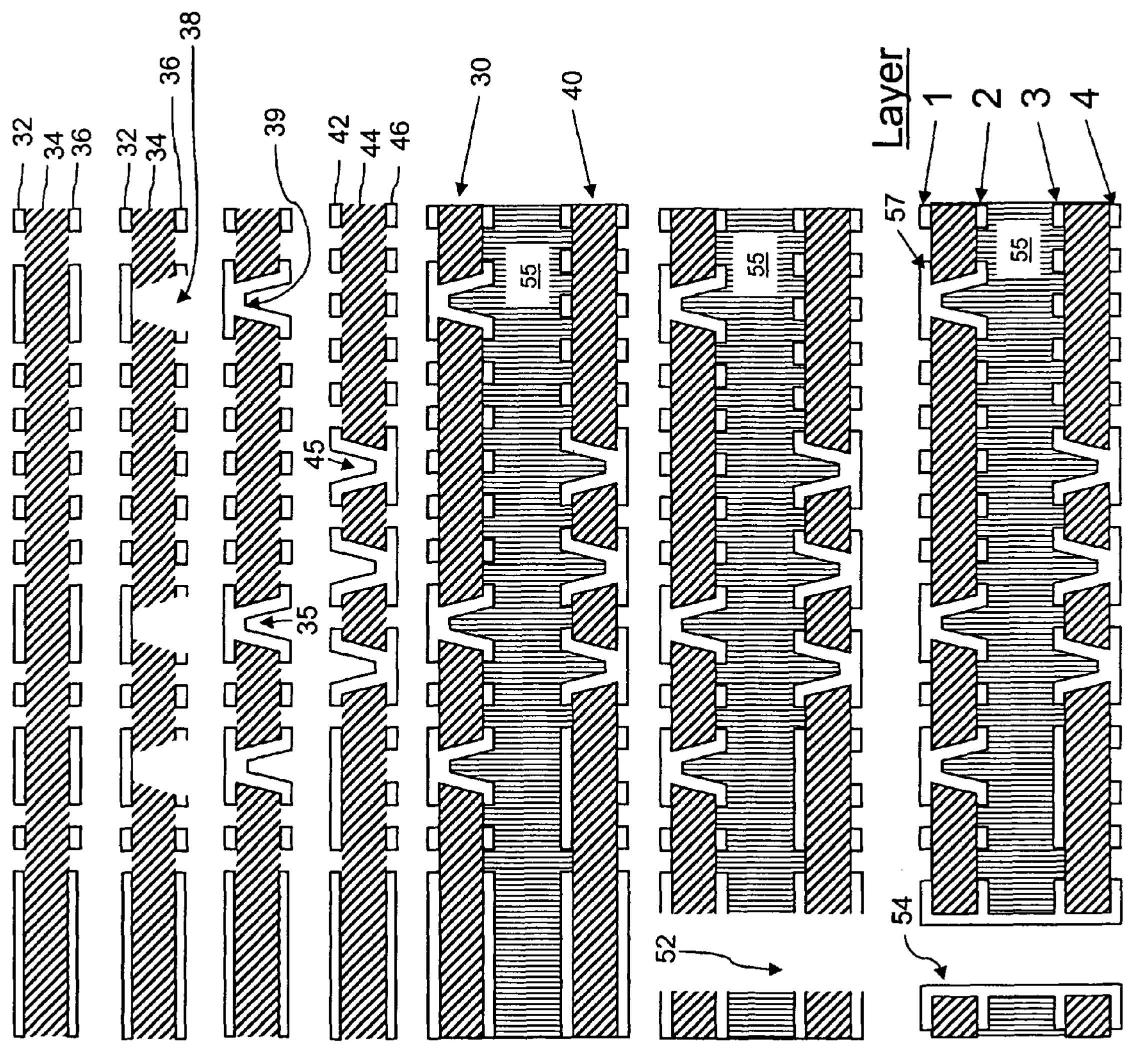
FIG. 3A is a cut view of a substrate having conductors on opposing sides in accordance with the present invention.
FIG. 3B illustrates the substrate of FIG. 3A with microvias in accordance with the invention.
FIG. 3C illustrates the substrate of FIG. 3B having the microvias plated in accordance with the invention.
FIG. 4 is a cut view of another substrate having microvias in accordance with the invention.
FIG. 5A is a cut view of multiboard assembly having pad caps in the form of a lamination of the substrates of FIGS. 3C and 4 in accordance with the invention.
FIG. 5B is a cut view of the assembly of FIG. 5A having a through-hole in accordance with the invention.
FIG. 5C is a cut view of the assembly of FIG. 5B having the through-hole plated in accordance with the invention.

Referring to FIGS. 3A through 5C, a multi-layer board with microvias and the method or process of making same is illustrated. The process can begin with a printed circuit board (PCB) 31 as shown in FIG. 3A having a core laminate or substrate 34 and a conductive layer 32 on a first side, a conductive layer 36 on a second side or an opposing side. The substrate 34 can be any dielectric material used for substrates such as FR4 and the conductive layer can be any conductor such as copper foil. The process can continue as shown in FIG. 3B by forming an opening or via 38 by any number of ways including by ablating through the conductive layer 36 and the substrate 34 so as to not penetrate completely through the conductive layer 32. The process can use a laser or other known methods to create the opening through the core laminate or substrate 34 while exposing the conductive layer 32 such as copper foil on the backside. Once the opening (via) 38 is fabricated, it is then plated with conductive material 39 and etched to make an electrical interconnect 35 or a double sided structure 30 as shown in FIG. 3C. Another double-sided structure 40 is shown in FIG. 4 having plated microvias or electrical interconnect 45 in a substrate 44 with conductive layers 42 and 46. A finished structure 50 as shown in FIG. 5C can use one or more of these double sided structures. Once the two layer or double-sided structure is complete, the next process can be to laminate these doubled-sided structures into one multiple layer structure 51 as shown in FIG. 5A using an adhesive or bonding layer 55 such as prepreg to couple double-sided structure 30 to doubled sided structure 40. The processed two layer boards (30 and 40) are stacked with the microvia opening facing each other (or down or inverted) as opposed to the standard process where stacked structures have microvias all facing up.

To optionally complete the finished structure 50 in the form of a four (4) layer structure 50 with pad caps 57 and interconnects among one or more of the 4 layers as shown in FIG. 5C, the multilayer structure 51 of FIG. 5A can further include a via 52 through all 4 layers as shown in FIG. 5B. Subsequently, the via 52 can be plated using conductive material 54.

It should be noted that the vias discussed above can be formed in numerous ways. For example, a YAG laser can be used to form vias through copper and lainimate or substrates while a $CO_2$ laser can be used to form vias through very thin copper and laminate. If a thick laminate is used, a photo-imaging process can preferably be used. Vias can also be formed using controlled depth drilling if desired. Thus, plasma etching, chemical etching, YAG laser drilling, $CO_2$ laser drilling, and photo imaging among other techniques can be used to form the vias and microvias discussed herein. Of course, these are only examples and in no way should limit the manner in which the vias or microvias are formed in accordance with the present invention.

Figures 6A, 6B, 6C, 6D:
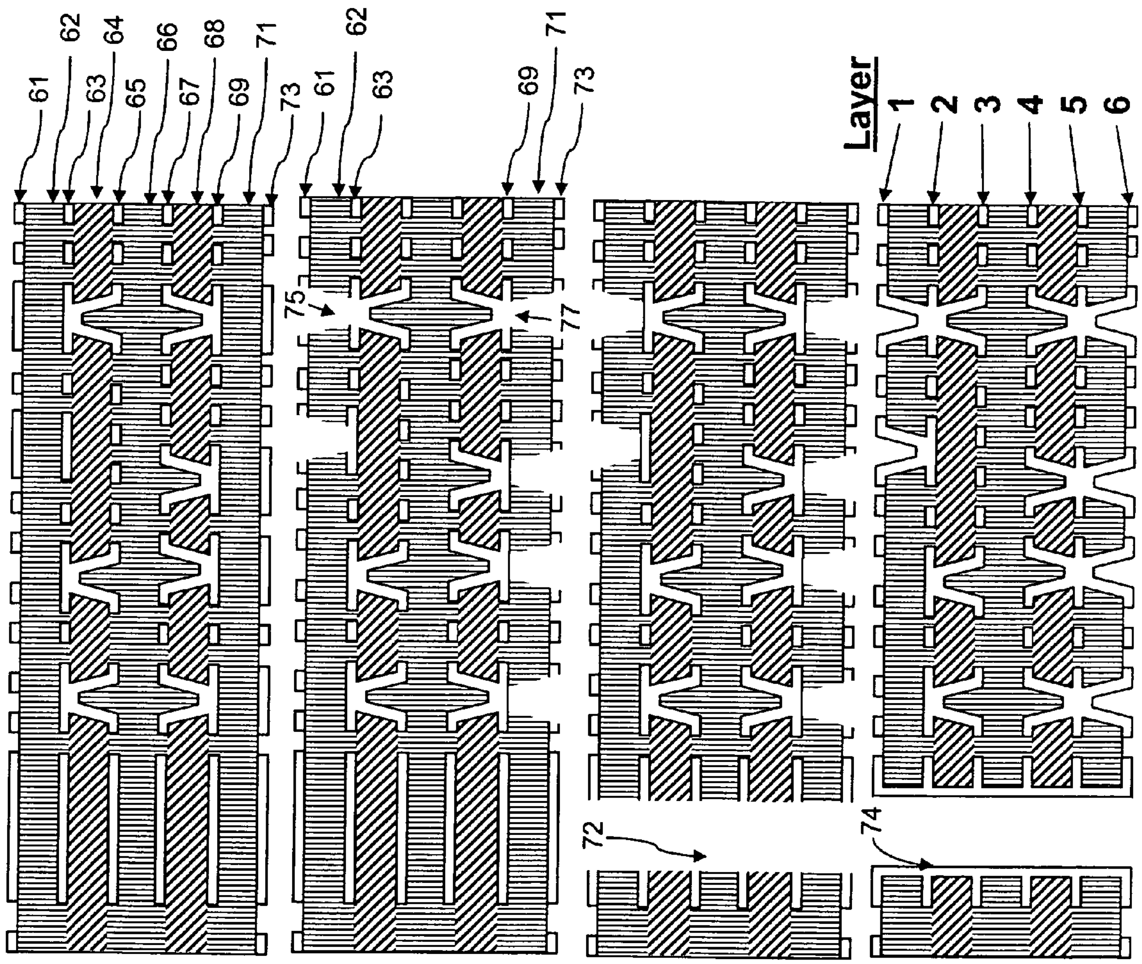
FIG. 6A is a cut view of a multiboard assembly such as a high density interconnect structure before processing in accordance with the present invention.
FIG. 6B is a cut view of the multiboard assembly of FIG. 6A with microvias in accordance with the invention.
FIG. 6C is a cut view of the multiboard assembly of FIG. 6B further including a through-hole in accordance with the invention.
FIG. 6D is a cut view of the multiboard assembly of FIG. 6C having plated microvias and a plated through-hole in accordance with the present invention.

With reference to FIGS. 6A–6D, a high density interconnect structure 70 can be formed using many of the same steps discussed above. Layers 2–5 of the multi-layer board 70 of FIG. 6D can be formed essentially the same way as layers 1–4 of FIG. 5C (before the through-hole (52 or 72) and plating process (54 or 74) in each instance). Thus, conductive layers 63, 65, 67, and 69 and substrates 64 and 68 and adhesive/bonding layer 66 of FIG. 6A are comparable respectively to conductive layers 32, 36, 42, and 46, substrates 34 and 44 and adhesive/bonding layer 55 of FIG. 5A.

Thus, during the lamination stack up process as discussed with reference to FIG. 5A, the multilayer board structure 60 of FIG. 6A can use an additional conductive layer 61 such as copper foil and an additional adhesive/bonding layer 62 such prepreg added to the top of the two layer board (30) and another adhesive/bonding layer 71 and conductive layer 73 added on to the bottom side of the two layer board (40) making up the finished board structure. This stack is then processed through a press making a multilayer board structure 60. It should be noted that conductive layers 61 or 73 (or any of the other conductive layers there between) can be an un-patterned ground plane or conductive plane or a patterned plane as desired. Also note that patterning of conductive surfaces can be done using plating, applying photolithography, and etching for example.

The next process step can be to form openings 75 and 77 on the top and bottom layers of the multilayer board structure 60 including those which could alight directly above the vias generated within the double sided structure as shown in FIG. 6B. Since the previous microvia in the core is facing down, a solid copper surface (horizontal) is available to process this top and bottom layer micro via onto. Another via or opening or through-hole 72 can also be formed through the multilayer board structure 60. After processing openings 75 and 77, such openings can be plated to form three metal layers (1, 2 and 3 or 4, 5 and 6) connected in a very small defined area. If not already done so, the process can also include the step of plating and etching the top conductive layers (61 and 73) to make appropriate circuit images. The plating and etching process can also include the step of plating the through-hole 72 to form the plated through-hole 74.

Today's existing methods require larger board area due to via annular ring pad sizes or construction techniques. These requirements limit routing density and increase the overall mouth size of the top via structure.

Figure 8:
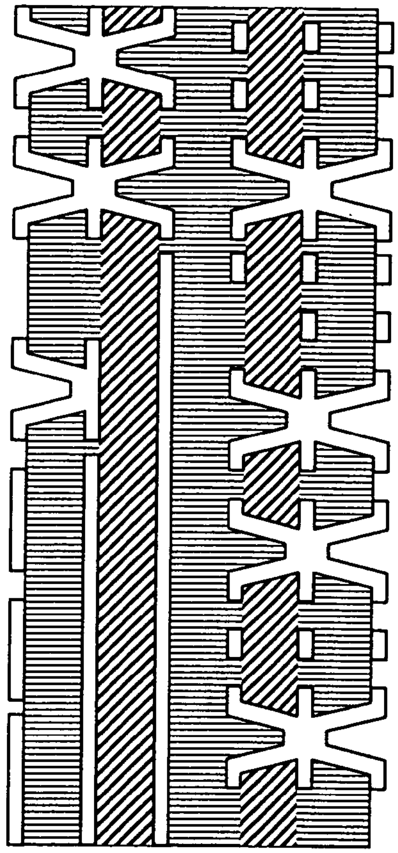
FIG. 8 is a partial cut view of the multiboard assembly of FIG. 7.
Figure 7:
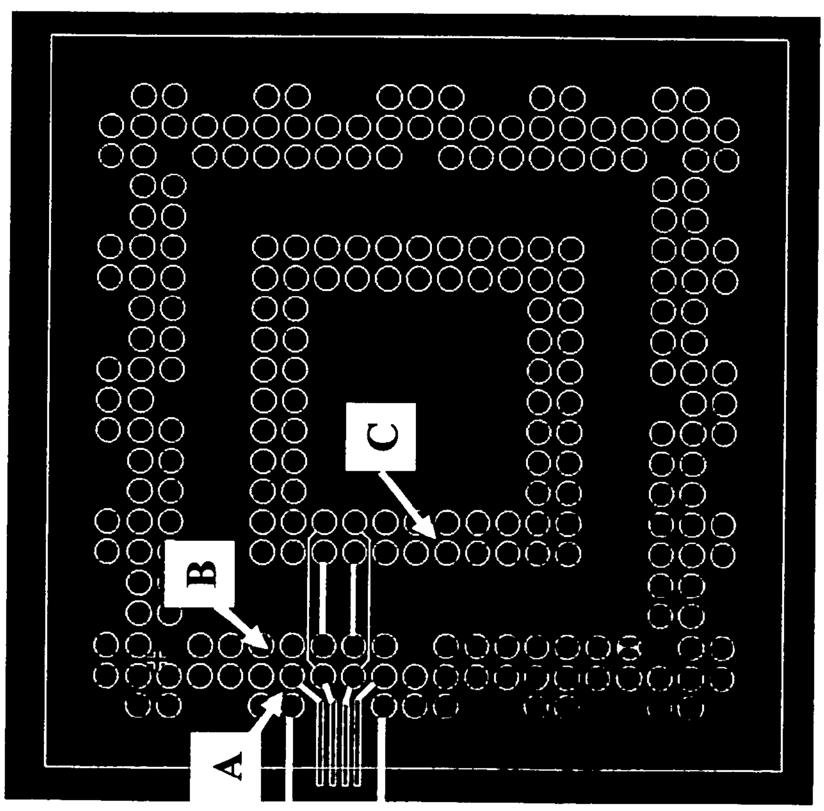
FIG. 7 is a top view of a multiboard assembly illustrating potential routing in accordance with the present invention.

The embodiment of FIG. 6D significantly reduces the area requirement of the via annular ring, freeing up additional routing channels and allows a vertical attachment method (of vias) to adjacent (1,2; 2,3; 1,2,3) and alternate layers (1,3). Finer pitch routing as shown in FIGS. 7 and 8 is enabled using the techniques described above. The inverted stacked microvias enable smaller and tighter packaging as shown in FIGS. 7 and 8 using the smaller diameters provided by microvias in the process described herein. In the process of making the multilayer board structure 70, many fabrication process steps are eliminated which typically add cost to the interconnect structure. The overall reliability of the inverted via can also be equal to that of the single micro via. The industry issues of via to via alignment or misregistration on stacked vias can be eliminated and thus provide superior reliability in a cost effective reliable structure using the structure and process in accordance with the present invention.

It should be understood that all interconnect structures which require a connection from one layer to others can incorporate the concepts discussed herein. The embodiments of the multilayer board structures discussed herein would be useful for product structures having fine pitch components or discrete devices. Additionally, the methods and structures discussed can be useful for structures which cannot afford a surface or which is not a flat surface (using pad caps) such as fine-pitched quad flat pack, fine-pitched connectors, and ball grid arrays or direct chip attached with a pitch smaller than 0.8 mm. This would limit the potential for solder voids and increase solder reliability. Any electronic device such as PDA's, Cell Phones, camcorders, computers, TV's, high resolution displays and their interconnects can certainly take advantage of the higher density interconnects and smaller footprint embodiments of the present invention enable.

Additionally, the description above is intended by way of example only and is not intended to limit the present invention in any way, except as set forth in the following claims.

What is claimed is:

1. A multilayer circuit board having inverted microvias, comprising:

at least a first substrate core and a second substrate core each of said first substrate core and said second substrate core having a top conductive layer on at least a top side;

a microvia on a bottom side of at least one among the first substrate core and the second substrate core, wherein the microvia would reach to the top conductive layer on at least the top side of at least one among the first substrate core and the second substrate core;

a conductive layer applied to the microvia interconnecting a bottom conductive layer to the top conductive layer of at least one among the first substrate core and the second substrate core;

an adhesive/bonding layer between at least the first substrate core and the second substrate core;

a hole through the first substrate core, the adhesive/bonding layer and the second substrate core;

a conductive layer applied to the hole to interconnect at least two among the top conductive layer of the first substrate core, the top conductive layer of the second substrate core, the bottom conductive layer of the first substrate core, and the bottom conductive layer of the second substrate core; and an external dielectric layer on at least one among the top side of the first substrate core and the top side of the second substrate core and an external conductive layer on the external dielectric layer, the external dielectric layer having a microvia with a conductive layer, wherein the conductive layer of the microvia of the external dielectric layer contacts the conductive layer of the microvia of the first substrate core or the second substrate core and wherein the microvias are vertically aligned with one another.

2. The multilayer circuit board of claim 1, wherein at least one among the top conductive layer of the first substrate core, the top conductive layer of the second substrate core, the bottom conductive layer of the first substrate core, and the bottom conductive layer of the second substrate core comprises a predefined pattern.

3. The multilayer circuit board of claim 1, wherein the hole further goes through the external dielectric layer and the external conductive layer.

4. The multilayer circuit board of claim 3, wherein the conductive layer applied to the hole interconnects at least two among the top conductive layer of the first substrate core, the top conductive layer of the second substrate core, the bottom conductive layer of the first substrate core, the bottom conductive layer of the second substrate core, and the external conductive layer.

5. A multilayer circuit board, comprising:

a plurality of substrate cores;

an adhesive/bonding layer between at least two among the plurality of substrate cores;

a microvia in each of at least two of the plurality of substrate cores, wherein the microvia includes a conductive interconnection between a top conductive surface and a bottom conductive surface of each of the at least two of the plurality of substrate cores, wherein at least a first microvia in a first substrate core is arranged to be inverted relative to a second microvia in a second substrate core, wherein the conductive interconnection of the first microvia contacts the conductive interconnection of the second microvia and wherein the first and second microvias are vertically aligned with one another; and a plated through-hole through the plurality of substrate cores and the adhesive/bonding layer, wherein the plated through-hole connects at least two among the top conductive surfaces and the bottom conductive surfaces of the plurality of substrate cores.

6. The multilayer circuit board of claim 5, wherein the multilayer circuit board further comprises an external dielectric layer on at least one among a top side of a first substrate core and a top side of a last substrate core and an external conductive layer on the external dielectric layer.

7. The multilayer circuit board of claim 6, wherein the multilayer circuit board further comprises a plated through-hole through the plurality of substrate cores, the external dielectric layer, and the adhesive/bonding layer, wherein the plated through-hole connects at least two among the external conductive layer, the top conductive surfaces of the plurality of substrate cores, and the bottom conductive surfaces of the plurality of substrate cores.

8. A method of forming a multilayer circuit board having inverted microvias, comprising the steps of:

providing at least a first substrate core and a second substrate core each of said first substrate core and said second substrate core having a top conductive layer on at least a top side;

forming a microvia on a bottom side of at least one among the first substrate core and the second substrate core, wherein the microvia would reach to the top conductive layer on at least the top side of at least one among the first substrate core and the second substrate core;

applying a conductive layer to the microvia to interconnect a bottom conductive layer of at least one among the first substrate core and the second substrate core to the top conductive layer of at least one among the first substrate core and the second substrate core;

patterning at least one among the top conductive layer and the bottom conductive layer of at least one among the first substrate core and the second substrate core;

applying an adhesive/bonding layer between at least the first substrate core and the second substrate core;

forming a hole through the first substrate core, the adhesive/bonding layer and the second substrate core;

applying a conductive layer to the hole to interconnect at least two among the top conductive layer of the first substrate core, the top conductive layer of the second substrate core, the bottom conductive layer of the first substrate core, and the bottom conductive layer of the second substrate core, applying an external dielectric layer to at least one among the top conductive layer of the first substrate core and the top conductive layer of the second substrate core, applying an external conductive layer to the external dielectric layer, creating a microvia through at least one among the external dielectric layer and the external conductive layer to expose at least one among the top conductive layer of the first substrate core and the top conductive layer of the second substrate core, and applying a conductive layer to the microvia to interconnect the external conductive layer to at least one among the top conductive layer of the first substrate core and the second substrate core.

9. The method of claim 8, wherein the step of forming the microvia comprises forming the microvia on the bottom side of the first substrate core and forming a separate microvia on the bottom side of the second substrate core such that each microvia reaches the respective top conductive layer on the first substrate core and the second substrate core.

10. The method of claim 8, wherein the step of patterning comprises patterning the top conductive layer and the bottom conductive layer of the first substrate core and patterning the top conductive layer and the bottom conductive layer of the second substrate core.

11. The method of claim 8, wherein the step of applying the adhesive/bonding layer comprises applying a dielectric layer between the bottom layers of the first substrate core and the second substrate core.

12. The method of claim 8, wherein the step of applying the adhesive/bonding layer comprises applying a dielectric layer on at least exposed portions of the first substrate core and the second substrate core and on at least portions of the bottom conductive layer of the first substrate core and the bottom conductive layer of the second substrate core.

13. The method of claim 8, wherein the step of forming the microvia comprises the step of at least one among plasma etching, chemical etching, YAG laser drilling, CO.sub.2 laser drilling, and photo imaging.

14. The method of claim 8, wherein the step of patterning comprises at least one among the steps of plating, applying photolithography, and etching.

15. The method of claim 8, wherein the method further comprises the step of laminating the first substrate core with the second substrate core by curing the adhesive/bonding layer in a vacuum lamination press.

16. The method of claim 8, wherein the method further comprises forming a hole through the external conductive layer, the external dielectric layer, as well as the first substrate core, the adhesive/bonding layer and the second substrate core and applying a conductive layer to the hole to interconnect at least two among the external conductive layer, the top conductive layer of the first substrate core, the top conductive layer of the second substrate core, the bottom conductive layer of the first substrate core, and the bottom conductive layer of the second substrate core.

17. The method of claim 16, wherein the step of patterning comprises at least one among the steps of plating, applying photolithography, and etching.

* * * * *